United States Patent [19]

Lee

[11] Patent Number: 4,981,222

[45] Date of Patent: Jan. 1, 1991

[54] WAFER BOAT

[75] Inventor: Steven N. Lee, Irvine, Calif.

[73] Assignee: ASQ Boats, Inc., Tustin, Calif.

[21] Appl. No.: 235,602

[22] Filed: Aug. 24, 1988

[51] Int. Cl.$^5$ ............................................. B05C 13/02
[52] U.S. Cl. ..................................... 211/41; 118/500; 118/728; 211/13; 432/253; 206/454
[58] Field of Search ................ 51/281 R; 211/40, 41, 211/13; 206/309, 454–456; 118/500, 728

[56] References Cited

U.S. PATENT DOCUMENTS

| | | | |
|---|---|---|---|
| 632,876 | 9/1899 | Meaker | 211/41 |
| 3,433,363 | 3/1969 | Clearman | 211/41 |
| 3,486,631 | 12/1969 | Rodman | 211/41 |
| 4,355,974 | 10/1982 | Lee | 211/40 |
| 4,505,393 | 3/1985 | Fleigle | 211/41 |
| 4,738,573 | 4/1988 | Johnson, Jr. | 409/193 |

OTHER PUBLICATIONS

ASQ Angle Slotted Wafer Systems; ASQ Boats Inc, 2650 Walnut Ave. Tustin, Calif. ©1986.

*Primary Examiner*—Robert A. Rose

[57] ABSTRACT

Wafer supporting method and apparatus having at least two wafer supporting slots for each edge-wise oriented wafer in a plurality of coaxial edge-wise aligned wafers. The two wafer locations are essentially at the bottom and at an upper "side" i.e., slightly below the widest diameter dimension of and edge-wise wafer with a pair of spaced apart upper slots having the same loose fitting cross-sectional shape as the lower slot. The supported wafer at the upper location touches the slot support at one slot wall only. A cross sectional shape of the slots for each wafer includes: (a) a rounded bottom wafer-supporting wall having a diameter that is essentially the same as the wafer's thickness; (b) an angle-controlling side wall; and (c) a third gravity feed wall that joins the tight fitting bottom to a wide loose fitting wafer entry slot opening. Close spacing between adjacent slots is provided by a pair of slot walls that are parallel to each other and are at the wafer lean angle.

7 Claims, 2 Drawing Sheets

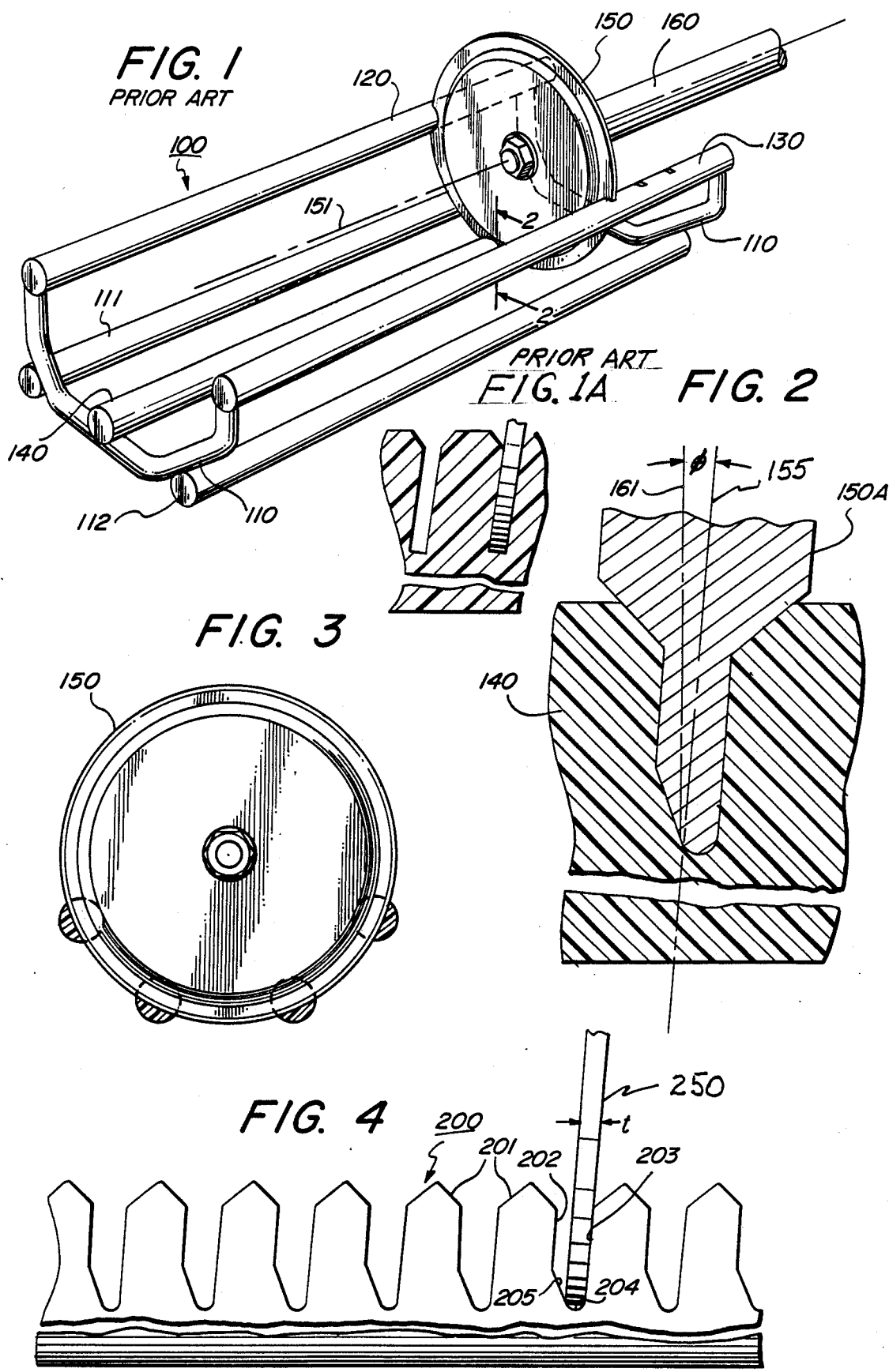

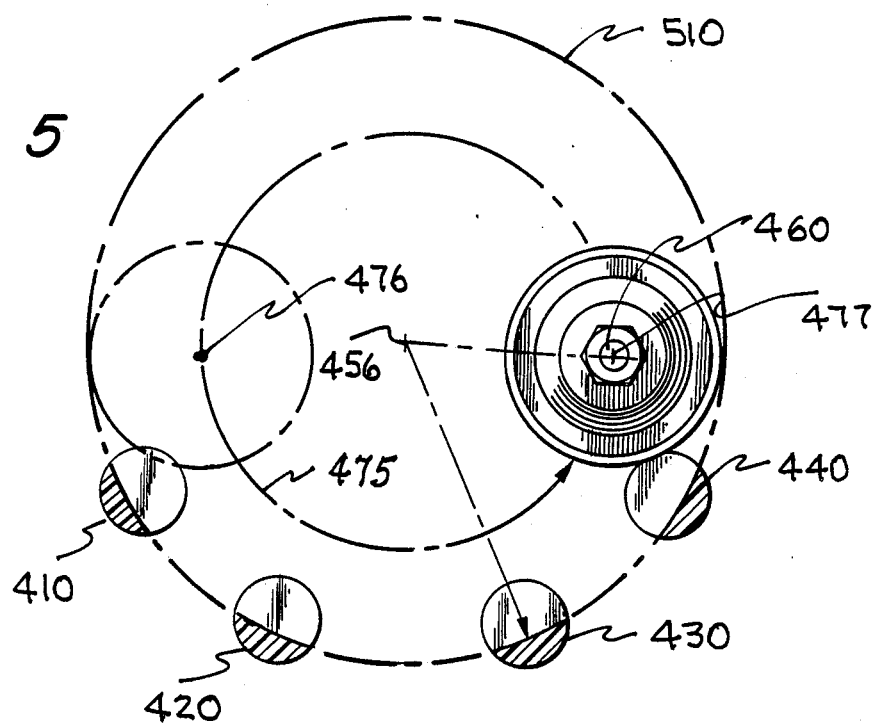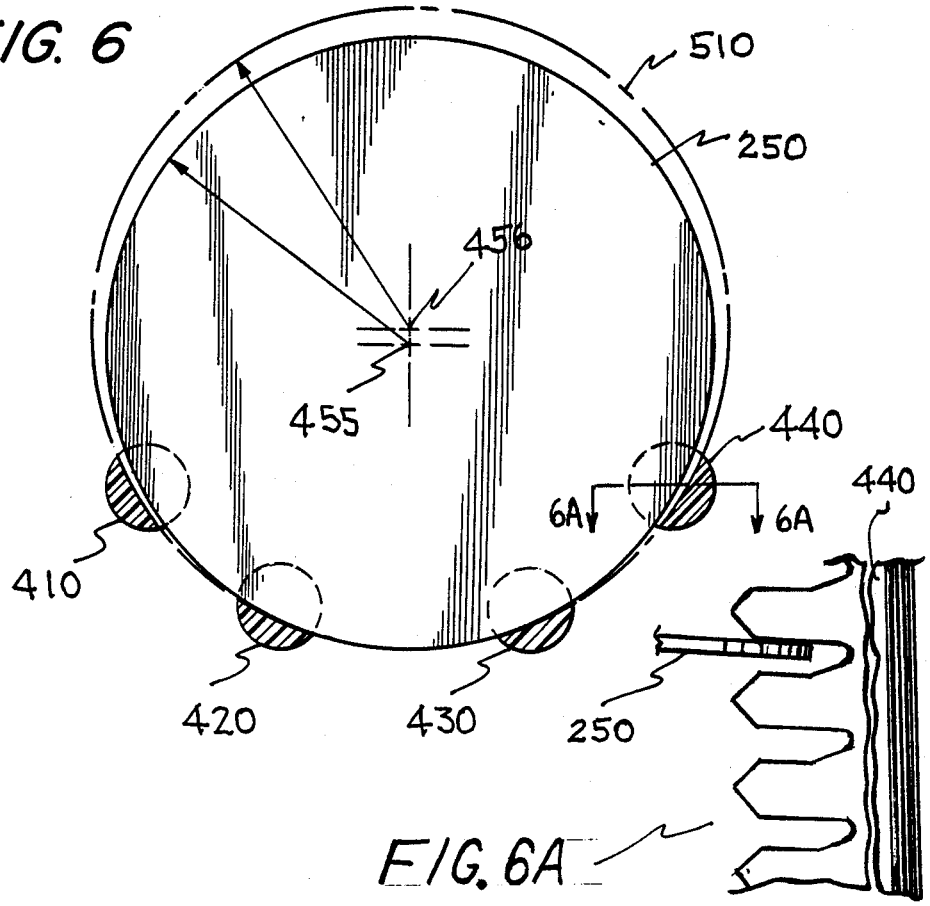

WAFER BOAT

BACKGROUND OF THE INVENTION

1. Field of the Invention

This invention relates to wafer handling apparatus and a method for manufacturing same. Thin wafers such as semiconductor masters are essentially circular and require coaxial alignment in wafer-carrying "boats". More particularly, this invention relates to a new and improved "boat" and a method of fabricating the boat so that a plurality of closely spaced wafer-supporting slots can be cut in a pre-assembled boat.

2. Description of Related Art Including Information Disclosed Under §§ 1.97-1.99

The assignee of this invention has several patents relating to this general art area. The most relevant patent is U.S. Pat. No. 4,355,974 ('974). Additional patents and publications of relevance to this invention are cited in the '974 patent. In accordance with the cited '974 patent, slots are cut at an angle to the vertical into rods that are thereafter used to form a wafer boat that is used for handling and processing.

Production yield is increased when angle-slotted boats are used and still further increases in production are achievable if the leaning angle of all the wafers is constant throughout the production life of a wafer boat. Such an art area has come to be known as angle-slotted boats to distinguish the Assignee's patented boats and the improved results achievable by the use thereof from the prior art's vertically-slotted boats. The invention of this application, however, is applicable to either type boat or related wafer handling device.

A Japanese patent No. 53-153,861 cited in a Reexamination of the '974 patent and many of the other references cited and discussed during the Reexamination proceedings discloses quite thoroughly the current state of the wafer boat art. In general the side (upper edge) and bottom (lower edge) slots in assignee's angle-slotted boats were formed in rods, or other wafer-supporting material, and the cuts which define the slots consisted of different configurations for the upper and lower slots. Several variations of different slot configurations for the bottom rods are shown in FIGS. 5 through 7 in the '974 patent. An additional prior art bottom slot configuration that has been in use by the assignee and which is not depicted in the '974 patent is in the nature of a small curved depression that is generally elliptically shaped. In accordance with the '974 patent, the side (upper) edges of the wafers are controlled in a desired leaning angle by sloped loosely cut slots and the wafer's weight was supported by a bottom rod which generally positioned the leaning wafers to provide an improved handling and processing operation.

Applicant was the first to purposely make the upper slots wider than the thickness of the wafers to be supported and to divide the wafer-leaning function and the wafer-weight-supporting function into two separate locations, namely the loosely fitting upper and the wafer-positioning lower position. Additionally a pair of opposed upper slots for each wafer are purposely spaced wider apart than the widest expected width of the wafer so that the wafer has room for a side to side movement of the type that it will experience in expanding during the high temperature processing of a wafer batch.

Cuts were first made in the rods and then the boats were assembled to fabricate the wafer boats of the '974 patent. Boat assembly involves high temperature glass fusion and the fusion creates slot alignment or slot deformation problems. It would be preferable if the slotting could be done in pre-assembled boats because the glass fusing of the slotted rods may create such alignment and deformation problems which are caused by high temperatures that are encountered during the assembly process. Slotting of pre-assembled boats, in contrast, avoids these problems.

During use the slotted boats are subject to high semiconductor-processing temperatures and are repeatedly acid washed between furnace firings for cleanliness reasons that are well known to the art. An improved yield can be obtained when the slot angles are maintained at constant angles in spite of repeated acid washings. Most slot configurations do not assure that the coaxially-aligned wafers in the boat will constantly lean at a fixed angle with equal spacing between adjacent wafers after repeated acid washings. Moreover, the slot design problem is further complicated in that adjacent wafer slots must be very closely spaced to keep the production yield at a maximum with lowest possible production costs.

Machine and computer control over X, Y and Z movements of the type necessary to slot angles in a slab or other type of wafer supporting material is well known. A plurality of essentially circular wafers which are coaxially aligned on a common center in a supporting surface, or boat, requires edge support at, or slightly below, the widest diameter position. This support allows use of wafer transfer combs of the type disclosed in the assignee's patent No. 4,568,234 issued Feb. 4, 1986, and now pending in a re-issue Application having Ser. No. 080,437 filed on July 31, 1987.

As noted above, slotting of vertical and angled slots in pre-assembled boats is a known art. The different slot configurations for side (edge) and bottom (weight) wafer contact locations for angle-slotted boats, or tightly fitting slots of the same configuration, has heretofore prevented successful slotting in such boats.

This invention for the first time discloses loose fitting angle slotting of side and bottom wafer locations having the same cross-sectional slot width of about twice the wafer thickness for adjacent wafers in a pre-assembled water boat wherein the leaning wafers touch one wall only at their upper edges. Suffice it to say that highly efficient production has not been achieved through the use of slotted pre-assembled boats prior to the advent of this invention. Moreover, the same unique shape for side and bottom slots which provides a loose fit for supported gravity-fed wafers while still allowing the lean angle of all wafers to be controlled throughout repeated acid washings are key features of this invention.

SUMMARY OF THE INVENTION

This invention discloses and claims a wafer supporting apparatus having at least two wafer supporting slots for each edge-wise oriented wafer in a plurality of coaxial edge-wise aligned wafers. The two wafer locations are essentially at the bottom and at an upper "side" i.e., slightly below the widest diameter dimension of an edge-wise wafer with a pair of spaced apart upper slots having the same loose fitting cross-sectional shape as the lower slot. The supported wafer at the bottom touches the slot support at two places and the supported wafer at the upper location touches the slot support at one slot wall only. A cross sectional shape of the slots for each wafer includes: (a) a rounded bottom wafer-supporting wall having a diameter that is essentially the same as the wafer's thickness; (b) an angle-controlling side wall; and (c) a third gravity feed wall that joins the tight fitting bottom to a wide loose fitting wafer entry slot opening. Close spacing between adjacent slots is provided by a pair of slot walls that are parallel to each other and are at the wafer lean angle. The unique slot shape of this invention allows the slots to be cut into a pre-assembled boat in which the edge-wise supported wafers have side to side translational movement (such as that a wafer experiences in high-temperature expansion) and also allows a gravity feed from a wide slot opening by a slanted non-supporting wall into an arcuate-shaped slot bottom. That bottom slot has an arcuate shape selected to be essentially as wide as the width of the wafer's thickness. The arcuate shape is a semi circle that is located between a slanted feed wall and a wafer-leaning wall of the wafer slot.

One surprising result of the invention's slot configuration is that at least a bottom and one or more side slots for each wafer in an angle-slotted boat can be cut concurrently into a pre-assembled boat. The method of the invention uses a blade with a cutting diameter that is slightly over-sized relative to the widest support locations chosen in the boat for supporting a plurality of edge-wise wafers. The wafers are fed into slot openings which are initially loose fitting and are fed naturally by a narrowing gravity feed wall until the wafers reach a snug tight fitting rounded slot bottom where they are supported at a common and controlled angle that still provides edge to edge and front to back translational movement during processing and handling.

BRIEF DESCRIPTION OF THE DRAWING

FIG. 1 is a simplified perspective view of one typical type of prior art slotting method for one type of known pre-assembled boat.

FIG. 1A is a cross-sectional view of the cutting edge of a prior art saw blade and rod.

FIG. 2 depicts a cross-sectional view of an improved saw blade cutting edge and rod in accordance with the invention.

FIG. 3 depicts a simplified front view of a four-rod boat being slotted in accordance with the invention.

FIG. 4 shows a series of slots formed in a boat support with the unique slot shape of this invention.

FIG. 5 shows a simplified view of a second prior art method of slotting another prior art boat with the cross sectional cutting edge of this invention.

FIG. 6 shows a partial front view of wedge-free wafer support at the upper edge of a wafer supported in accordance with the wafer slot cross section of the invention.

FIG. 6A shows a partial top view of a section taken along the lines 6A—6A of FIG. 6.

DESCRIPTION OF THE PREFERRED EMBODIMENT(S)

FIG. 1 shows one of several typical "boats" that was pre-assembled in a slot-free configuration. Boat 100 has a pair of essentially U-shaped front and rear end braces 110 that are joined at the top by a pair of horizontal spaced parallel rods 120, 130. At the bottom of the boat 100 is located a bottom rod 140. The three rods 120, 130, and 140 are suitably spaced to hold a batch of wafers of a predetermined size when wafer-supporting slots have been cut into the boat 100. These rods have their ends flush with, or extending slightly beyond the outer edge of braces 110 so that the slots in the boat can be contiguous with the slots in another boat when the other boat is butted end-to-end with boat 100. The additional rods 111, 112 of boat 100 are for support and form a stable base for the boat.

Several other types of known prior art boats, not shown, are to be understood as being within those that can receive the method and apparatus of this invention. These other types include those that, rather than three, include four or more inner rods (see FIG. 5, for example ) or those having a mix of flat or round rods which form a wafer supporting semi-circular "saddle". Other known boats include those one-piece type which have flat or curved slabs for receiving the wafer slots. Any of these prior art boat types may be slotted by known techniques similar to that of FIGS. 1 or 5.

Saw blade 150 (FIG. 1) is mounted for high speed cutting into boat 100 at the forward end of a rotatable shaft 160 that is driven by any suitable motor (not shown). There are several known ways to cut slots into a boat and FIG. 1 shows a way that is called a plunge cut. In this operational method, the saw blade 150 is selected to be slightly larger in diameter than the diameter of the wafers to be handled by the boat. Any suitable X-Y-Z plotting table in conjunction with a numerically or computer-controlled machine will center the blade 150 along the geometric center 151 (shown dashed) of the boat 100. Software control guides the movement of blade 150 into and out of the boat 100. Blade 150 cuts closely spaced slots (see FIG. 1A) at a predetermined depth into the three rods 120, 130 and 140. (The depth of the cut, of course, must not unduly weaken the rods).

Relative positioning of the boat 100 and the axis of rotation of the blade 150 may be obtained in any of several known ways. The boat 100 may be held during cutting in a jig that is wedge shaped at the complementary angle to $\phi$ while the blade 150 is moved into and out of the boat 100 in a vertical direction. Alternatively the boat may be positioned in a horizontal position and the blade moved in and out of boat 100.

The width of the cutting edge (FIG. 1A) is chosen to be only slightly wider than the thickness of the wafer to be supported. The prior art philosophy was to use these tight fitting slots so that random leaning at different angles was avoided. Unfortunately these tight prior art slots suffer width and other degradation with repeated acid washings and thus the hoped-for goals of the tight fitting prior art slots were not achieved.

FIG. 2 shows an enlarged partial cross section of the cutting periphery of an improved blade 150 embedded in a cutting position in one of the rods such as bottom rod 140. The abrasive wheel periphery 150A has its geometric center line 155 at a slight angle to the vertical 161. In accordance with the teaching of the '974 patent $\phi$ may be between about two to ten degrees or so. The unique saw blade cross section 150A achieves an improved production yield over the prior art because it does not suffer from wafer pinching and distortion caused by tight ill fitting slots or, from wafer production degradation, resulting from non-uniform leaning of wafers that is caused by acid washing. FIG. 4 depicts, in a cross-sectional view of the top of the bottom rod 140, a series of finished slots 20 ) after they have been cut by blade 150A.

As shown in FIG. 4, each slot 200 at the upper entrance level includes a pair of inwardly directed bevels 201 that may be at an angle of about 45 to 60 degrees from the slot's geometrically-centered axis 155. These bevels 201 lead downwardly into a pair of parallel slot walls (202 and 203) that are spaced apart by about twice the thickness —2t— of the wafer 250. The rightmost wall 203 is tangent to an arcuate-shaped bottom wall 204. Bottom 204 is defined by the lower portion of a circle having a radius of —t/2—, where t is the thickness of a wafer to be held in slot 200. Feed wall 205 joins the bottom 204 to the leftmost wall 202. The longer wall 203 of the parallel slot walls is the wall against which the wafer will lean and thus it is at the same chosen angle $\phi$ as that selected for type angle-slotted boat.

Feed wall 205 is selected at a counter-angle of about 30 degrees relative to the wafer leaning angle. Feed wall 205 swerves the function of guiding a wager as it is received into the slot 200 to the slot's bottom 204. Gravity will cause the wafer to drop to the lowest point at the rounded bottom 204 of slot 200 and that same gravity feed will assure that the wafers all lean at a common angle in the boat 100 as determined by a series of parallel walls 203. All of the slots 200 are identical and all of them cooperate together to control the non-wedged support that is so important in the wafer processing art.

By wedge free, I mean that the leaning wafers have a translational freedom from side to side, and back and forth, at the upper support location. Moreover, the slots in weight supporting rods at the bottom, for wedge-free processing, must not induce wafer bending or binding during the handling or processing. An abrasive blade, such as a diamond wheel, may be shaped as desired. One or more passes can be used to create the slot shape of the invention. Such blades wear slowly and many cuts can be made before blade wear creates any problem in the dimension of the slots that are made in boat 100. It is nevertheless a problem since, as noted above, the slot diameter must be slightly larger than the wafer diameter to provide wedge-free processing and the blade wear reduces the precise tolerances that are required in this art. As an example the saw blade diameter of FIG. 1, when employing the unique shape of this invention, may be about 0.050 inches larger than the average wafer diameter to be handled, leaving about 0.020 to 0.025 inches between the slot bottom and the outer edge of each leaning wafer in the opposed slots in each side rod 120 and 130 for a given wafer.

In one particular embodiment of this invention, the saw blade, whether a single blade of the plunge cut type (FIG. 1 or FIG. 3), or a scribed swath (as shown in FIG. 5) is chosen larger than the wafer to provide slots that are loose fitting. In FIGS. 5 and 6, the centers of a saw blade swath and a wafer 250 are relatively offset in a vertical direction from one another. The wafer's center 455 is coincident with the boats longitudinal axis, such as axis 151 of FIG. 1. By offsetting these two centers, and selecting the widest swath of the cut to be greater than the wafer's diameter the wafer can drop to the slot bottom and yet be loose at the upper edges. Note that a gradual increase is provided between the wafer's contact at rods 420, 430 and the upper rods 410, 440. The combination of the center offset and selecting a slot cut's diameter to be greater than the wafer's diameter, and the slots width to be about twice the wafer's thickness, provides a loose and wedge-free support of the wafers in accordance with the method and apparatus of this invention. In some wafer processing known as back-to-back processing, two wafers occupy each slot and chemical processing does not occur on the touching back surfaces of a wafer pair in a single slot. In such an instance, the slot width must be increased by an amount equal to the extra wafer thickness, and the principles of this inventions are still applicable.

In the operational approach of FIG. 5, also suitable for practicing the method of making a wafer boat in accordance with this invention, a smaller abrasive wheel 450 (with the desired slot-making shape of FIG. 2 machined therein) is turning at very high speed on a movable shaft 460. The shaft's movement is controlled in essentially a semicircular path 475 as shown in FIG. 5 between point 476 and 477. The smaller blade 450 moves in a semicircular arc within the boat's four rods 410, 420, 430 and 440. This movement sequentially cuts, for example, first rod 410, next rod 420, then rod 430 and finally rod 440. The arc is precisely controlled so that the depth of the slots is within the strict tolerances that are required. In this alternate approach, the wear on a blade can be compensated for by slight variations in the software control over the depth of the shaft's movement in the arc. In either approach, however, the individual wafer slots for co-axial alignment of a batch of wafers is cut into the material of a non-slotted boat in order to loosely support them in a wedge-free manner.

Since all of the slots are identical they all tend to suffer uniformly in the acid washing and improved results are obtained by the method and apparatus of this invention.

The above description presents the best mode contemplated in carrying out my invention. My invention is, however, susceptible to modifications and alternate constructions from the embodiments shown in the drawing and described above. Consequently, it is not the intention to limit the invention to the particular embodiments disclosed. On the contrary, the invention is intended and shall cover all modifications, sizes and scope of the invention, as in the appended claims when read in light of the description and drawings.

I claim:

1. Apparatus of a slotted wafer boat for holding a plurality of coaxially aligned essentially circular wafers, comprising:

means defining an essentially semicircular wafer receiving saddle in a wafer boat, said boat further characterized by:

a wafer slot the shape of essentially a semicircular arc that matches the wafers to be loaded, with the arc's size selected to be slightly larger in diameter than the diameter of the wafers to be held in an upright edge-wise position in said boat, with each of said wafers being in essentially continuous leaning support at a predetermined angle in flat surface contact against a wafer-supporting slot wall for said boat;

said predetermined angle for said slot is essentially vertical; and a cross-sectional shape for the wafer's slot which includes a plurality of slot-defining walls in which at least one slot wall of all wafer slots in the boat is at said predetermined essentially vertical angle, a sloped and opposed feed wall, a rounded bottom wall smoothly joining said slot wall and said opposed feed wall, wherein said feed wall is at a different angle selected to guide a wafer by gravity from said feed wall into said rounded bottom and into surface-to-surface contact against said predetermined angle wall, and wherein said angled wall provides essentially a flush contact with a wafer it is supporting at said predetermined angle.

2. Apparatus for receiving and handling a plurality edge-wise coaxially spaced essentially upright wafers of a general circular shape, said apparatus comprising:
   a wafer slot for each spaced wafer in the shape of essentially a semicircle that matches the wafers to be loaded, with the size of the semi-circular shape selected to be slightly larger than the diameter of the wafers to be held in said generally upright edge-wise position in said boat, said slot being characterized in that it is:
   angled in the boat at a slight predetermined angle to the vertical; and
   shaped in cross section so as to have one slot wall at the predetermined angle, with said one slot wall smoothly leading into a rounded bottom wall and smoothly continuing into a sloped opposed feed wall at a counter angle that guides a wafer by gravity into the rounded bottom, such that said wafer is supported flushly against said angled slot wall while resting on said rounded bottom wall.

3. Apparatus in accordance with claim 2 and further comprising:
   a plurality of slots, with each slot of said plurality having one wall thereof spaced at said predetermined angle and all of said one walls being parallel to each other in said boat.

4. Apparatus in accordance with claim 3 and further comprising:
   an upper boat structure extending generally along one inner side of said boat for receiving an edge portion of each of said plurality of wafers at a location on the coaxial wafers being held that is slightly below the wafer's widest diameter; and
   another boat structure that is lower than the upper structure for receiving another edge portion of each of said plurality of wafers being held on a location near the bottom of the wafers.

5. Apparatus in accordance with claim 4 and further wherein:
   said upper and lower boat structures are rods.

6. Apparatus in accordance with claim 5 and further wherein:
   said upper boat structure comprises a pair of horizontal spaced apart rods with said cross sectional slots being cut into the inner side of both of said rods of said pair; and
   said lower boat structure comprises at least a third horizontal rod that is sPaced away equally from each of the rods in said pair of upper rods, with said third rod also having said cross sectional slots being cut into the inner facing side of said rod.

7. A slotted waver boat that is slotted after the boat is assembled as a slotless boat stock, said wafer boat for holding a plurality of coaxially aligned essentially circular wafers, each having an expected and essentially constant thickness, and said slotted boat comprising:
   means defining an essentially semicircular wafer receiving saddle in said boat;
   said saddle's cross section characterized by wafer guiding and contact leaning surfaces which further comprise:
   a wafer slot in the shape of an essentially semicircular arc that matches and is slightly oversized in comparison to the wafers to be supported, with the arc's size selected to be slightly larger in diameter than the diameter of the wafers to be held in an upright edge-wise position in leaning contact against a predetermined wafer support wall;
   a cross-sectional shape for the wafer's slot which includes a plurality of slot-defining walls in which at least one slot wall of all wafer slots in the boat is at said predetermined angle and smoothly continues into a rounded bottom wall of diameter about the thickness of said wafer, with said bottom wall smoothly continuing into a sloped opposed feed wall at a different angle selected to guide a wafer by gravity into the rounded bottom wall; and said shape is further characterized in that
   said wafer is supported flushly into essentially continuous leaning contact between said wafer and the wafer support wall at said predetermined angle.

* * * * *